(12) United States Patent
Wennekamp (10) Patent No.: US 6,172,525 B1
(45) Date of Patent: Jan. 9, 2001

(54) INTERFACE CIRCUIT WITH SLEW RATE CONTROL

(75) Inventor: Wayne Wennekamp, Rio Rancho, NM (US)

(73) Assignee: Philips Electronics North America Corporation, New York, NY (US)

( * ) Notice: Under 35 U.S.C. 154(b), the term of this patent shall be extended for 0 days.

(21) Appl. No.: 09/074,226

(22) Filed: May 7, 1998

(51) Int. Cl.$^7$ .............................................. H03K 19/0175
(52) U.S. Cl. .................................. 326/83; 326/82; 326/86
(58) Field of Search .................................. 326/17, 57, 58, 326/56, 26, 27, 82, 83, 86, 112, 119, 121, 113

(56) References Cited

U.S. PATENT DOCUMENTS

| | | | |
|---|---|---|---|
| 4,622,482 | 11/1986 | Ganger | 307/585 |
| 5,111,076 | * 5/1992 | Tarng | 307/446 |
| 5,319,252 | 6/1994 | Pierce et al. | 307/263 |
| 5,500,611 | 3/1996 | Popat | 326/87 |
| 5,684,410 | * 11/1997 | Guo | 326/27 |
| 5,717,343 | 2/1998 | Kwong | 326/27 |
| 5,920,210 | * 7/1999 | Kaplinsky | 327/112 |

FOREIGN PATENT DOCUMENTS

WO9524076   9/1995   (WO) .............................. H03K/17/16

* cited by examiner

*Primary Examiner*—Michael Tokar
*Assistant Examiner*—Anh Tran
(74) *Attorney, Agent, or Firm*—Tony E. Piotrowski (57) ABSTRACT

A circuit includes a drive transistor or selectively coupling an output terminal to a power supply. The transistor has a control terminal coupled to an input terminal by a slew rate control device to control the slew rate of the drive transistor. In an embodiment, the slew rate control device includes two parallel pass gates which implement a variable resistance for switching between a normal and a slow slew mode. In one embodiment, a tri-state output buffer is disclosed including a pull-up device and a pull-down device, each with associated pass gates for implementing slew rate control. In a favorable embodiment, a control circuit controls the pass gates so that in the slow slew mode, the drive transistors turn off as quickly as in the normal slew mode.

26 Claims, 4 Drawing Sheets

INTERFACE CIRCUIT WITH SLEW RATE CONTROL

BACKGROUND OF THE INVENTION

1. Field of the Invention

The invention relates to interface circuits for binary signal processing devices. More particularly, the invention relates to a slew rate control aspect of such interface circuits.

2. Description of the Prior Art

Numerous circuit applications require an interface circuit, such as an input circuit or an output circuit, for transferring a logic value between two terminals. In the simplest form, a drive transistor has a control electrode coupled to a first terminal and main current path which couples the second terminal to a selected power supply. When a signal received at the first terminal turns the drive transistor on, the other terminal is pulled to the potential of the power supply. In this way, the second terminal can be supplied with a different current than the driving signal at the first terminal.

One common use for interface circuits is for binary signal processing devices, such as standard and programmable logic devices. These devices have a core with a great number of logic arrays each of which output a logic signal that must be coupled to associated input/output pins of the device. The purpose of interface circuits is to ensure that data is communicated correctly with other devices, such as over a communication bus, and these circuits are accordingly designed to withstand dangers which they may reasonably be expected to encounter.

A commonly used interface circuit is a tri-state output buffer, which is characterized by its three possible output states: "low", "high" and "tri-state". The typical tri-state buffer has an output terminal, a pull-up device to selectively couple the output to a first supply and a pull-down device to selectively couple the output to a second, lower supply. The buffer is in the "tri-state" mode when both of the pull-up and pull-down devices are in the non-conductive "OFF" state, thereby presenting a high impedance to the output.

U.S. Pat. No. 5,500,611 (Popat et al) shows a tri-state output buffer with a high and a low power mode. The low power mode is provided by a weak pull up device and is used in a sleep mode, while the high power mode is provided by a strong pull up device. Both pull-up devices include normally cut-off FET's with a main current channel coupled to an output node and to a supply terminal. The strong pull-up device differs from the weak pull up device in that when the FETs are enabled the main current path of the weak pull-up device has a higher resistance than the main current path of the strong pull up device. Thus, when the weak pull up device is activated, its higher resistance provides a smaller current to the output pin than when the strong device is activated, in a ratio of 1:4. The different resistances are obtained through selection of different lengths and widths of the main current paths of the FETS.

In binary signal processing devices having a large number of output pins and associated interface circuits, power surges are possible when a large number of drive transistors are nearly simultaneously enabled, due to switching transients. However, minimizing power consumption whether in the steady state as in Popat or during switching often conflicts with minimum current requirements for external devices connected to the interface circuit. For example, standards for communication buses often have minimum current levels to be maintained. A PCI bus must maintain an AC drive current of −40 mA pull-up and 53 mA pull-down.

SUMMARY OF THE INVENTION

Generally speaking, according to the invention, an interface circuit includes an input terminal for receiving an input signal, an output terminal, and a drive transistor having a main current path coupling the output terminal to a power supply. A slew rate control device has an impedance selectively coupleable between said input terminal and a control terminal of said drive transistor to selectively control the switching speed of said drive transistor and the slew rate of the signal at the output terminal relative to the input signal. Slew rate is a measure of the rate of change of the output signal in response to a change in the input signal. With the impedance between the input terminal and the control gate, the voltage rise (or fall) at the control gate is slowed, as compared to the absence of such impedance, upon transition of the input signal, so the switching speed of the drive transistor as reduced.

The aim of Popat was to provide a device with a low power consumption in a sleep mode. It is noted that the low and high power modes also correspond to a low and a high slew rate in Popat. Popat's strong and weak pull-up devices effectively couple a different resistance between the output node and the supply rail, so that the output node will be pulled up faster when the strong pull-up device is enabled than when the weak pull-up device is enabled. However, the current supplied to the output pin is directly dependent on the slew rate in the steady state, as it depends on the selected characteristic of the FET's main current channel.

By contrast, in the present invention, the current supplied to the output node is not dependent on the slew rate. Rather the slew rate is controlled by an impedance placed between the input node and the control terminal of the drive transistor. The output node is still coupled to the supply rail by the main current channel, but now a slow slew rate can be obtained with a drive transistor having a low resistance main current path. Consequently, the drive transistor can be selected to provide a steady state output current of a desired level to an external device, such as a bus, while having a desired slew rate based on the selection of the impedance placed between the input node and the control terminal of the drive transistor.

Additionally, in the present invention multiple slew rates may be achieved with only one drive transistor by interposing multiple selectable impedances between the input terminal and the control gate of the drive transistor, whereas the device of Popat requires a different drive transistor for each slew rate. Such impedances are provided in an embodiment by slew rate control transistors coupled in parallel between the input terminal and the control gate of the drive transistors. The main current paths of the slew rate control transistors have different resistances which, when coupled with the gate capacitance of the drive transistor, provides an impedance. Different impedances are obtained by selectively enabling the slew rate control transistors. Multiple slew rates can be implemented in the device according to the invention with lesser die area, as the resistive slew rate transistors present between the input node and the control terminal of the drive transistor can be smaller since they are not in the supply current path.

According to a favorable embodiment, a pass gate is coupled between the input terminal and a control terminal of the drive transistor and is switchable between an enabled state, in which the pass gate exhibits a selected resistance, and a disabled state, in which the pass gate presents an open circuit. A slew rate control input is coupled to control terminals of the pass gate to control switching of the pass gate between the enabled and disabled states. When switched to the enabled state, the resistance of the pass gate coupled with the gate capacitance of the drive transistor provides an RC time constant which slows the rate of change of the voltage at the drive transistor's control terminal arising from a transition of the input signal. Favorably, a second pass gate, having a second resistance different from the first resistance, is coupled electrically in parallel with the first pass gate between the input terminal and the control terminal of the drive transistor. The two pass gates are selectively enabled to implement a variable resistance between the input terminal and the control terminal of the drive transistor.

A particular advantage of the use of pass gates as resistors is that pass gates have a PMOS and an NMOS device in parallel which provides significantly less signal degradation than when only one transistor is used. Additionally, since the devices are in parallel, a desired resistance can be achieved with smaller (less wide) devices than with multiple transistors in series.

In an embodiment, the interface circuit includes a control circuit with logic gates that implement the fast and slow slew rate modes based on the logic level of the slew rate input. Favorably, the control circuit is further coupled to the output terminal and controls the pass gates in dependence of a logic level of the output terminal. By monitoring the output terminal, the control circuit may control the pass gates to ensure that the drive transistor turns off more rapidly than it turns on.

In yet another embodiment, a tri-state output buffer includes a pull-up device and a pull-down device. A respective input terminal is coupled to a control terminal of each device by a respective pair of electrically parallel pass gates. Each of the two pairs has one pass gate with low resistance for implementing a normal slew rate mode and second pass gate with a higher resistance for implementing a slow slew rate mode. A control circuit is for implementing a slow slew rate mode. A control circuit is coupled to the control terminals of the pass gates and to a slew rate control input. In a normal slew mode, the control circuit controls the pass gates so that the low resistance pass gates are always enabled, regardless of the state of the output terminal. In the slow slew mode, the control circuit alternately enables the high resistance pass gates to ensure that the pull-up device and the pull down device each turn on slowly, yet turn off as quickly as in the normal slew mode, to reduce feed through current.

The invention also relates to a binary signal processing device having a binary signal processing core with a plurality of outputs, a plurality of connection pins, and plurality of interface circuits, each with a drive transistor and pass gate controlled slew rates.

These and other object, features and advantages of the invention will become apparent with reference to the following detailed description and the drawings.

DETAILED DESCRIPTION OF THE PREFERRED EMBODIMENTS

Figure 1A:
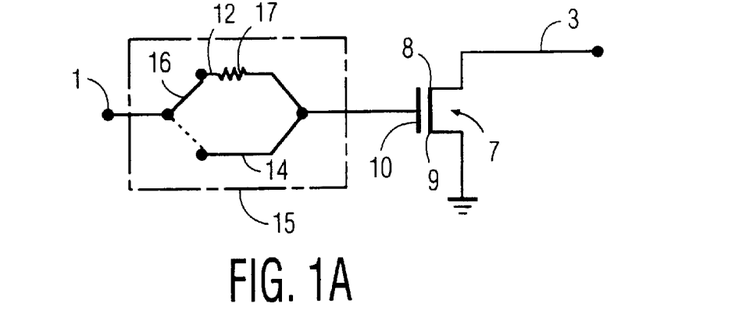
FIG. 1 is a circuit diagram of a drive transistor circuit employing a pass gate for slew rate control.

FIG. 1(a) is a circuit diagram illustrating a drive transistor with slew rate control according to the invention. The circuit includes a first, input terminal 1, a second, output terminal 3 and a drive transistor 7, which includes a main current path extending between first and second conducting electrodes 8, 9, and a control terminal, or gate, 10. The drive transistor 7 shown is an NMOS device. In the conductive state of the transistor, the main current path couples the second terminal 3 to a supply, in this case ground. Therefore, the transistor 7 serves as a pull-down device. The slew rate is a measure of how fast the signal at the output 3 changes in response to a change in the input signal at input terminal 1.

The state (conductive=ON; non-conductive=OFF) of the pull-down device 7 is controlled by the signal input at the first terminal 1. The input terminal 1 is coupled to the gate 10 by a slew rate control device 15 having a first path 12 which includes resistor 17 and a second path 14. When the switch 16 is in the position indicated by the dashed line, it couples input terminal 1 directly to the control terminal 10 of drive transistor 7. In this switch position, the drive transistor has a normal switching speed and provides a normal slew rate between the output terminal and the input signal. When the switch 16 is in the position indicated by the solid line, the input terminal is coupled to gate 10 by resistor 17. When the input signal at terminal 1 transitions to logic high to turn drive transistor 7 ON, the RC impedance of the resistor 17 in conjunction with the gate capacitance of the transistor 7 slows the voltage rise at gate 10, as compared to when path 14 is connected, which slows the switching speed of the transistor 7 from the OFF to the ON state. Since drive transistor 7 now turns ON more slowly, the slew rate of the output terminal is slower than in the normal slew mode. However, the slew rate is independent of the steady state current supplied by the supply terminal (ground in this instance), as no impedance is imposed between the supply and the output terminal for the purpose of slew rate control.

Figure 1B:
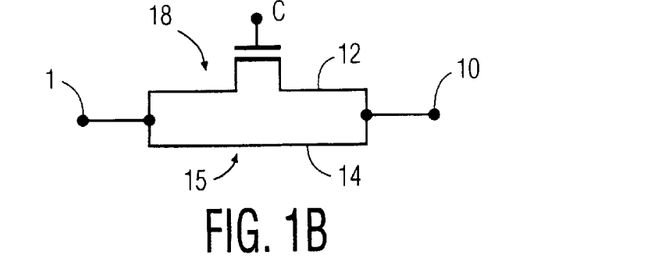

FIG. 1(b) shows one circuit embodiment of the slew rate control device 15 in which the switch 16 and resistor 17 are formed in path 12 by an NMOS slew rate control transistor 18 having a main current path coupled between the terminal 1 and gate 10, and a control terminal (gate) coupled to a slew rate control terminal C. When the signal at terminal C is low, the transistor 18 is OFF so the normal slew mode is active. When the control signal at terminal C is high, the transistor 18 is ON and the main current path has a characteristic impedance depending on the dimensions and doping of the main current channel. Turning transistor 18 ON, provides a small increase in impedance between the input terminal and gate 10 (due to the parallel nature of the paths 12, 14) as compared to when the transistor is OFF, and a small decrease in slew rate.

Figure 1C:
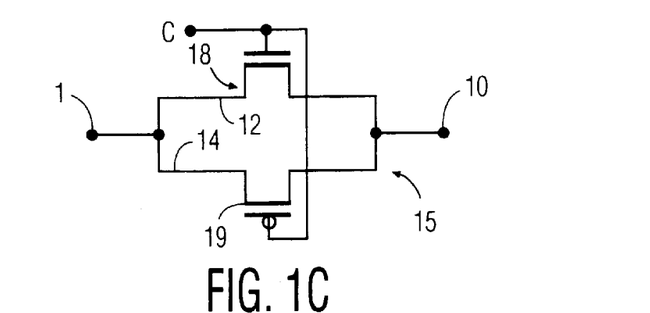

FIG. 1(c) is another embodiment, employing an NMOS transistor 18 and a PMOS transistor 19 in parallel. The transistor 18 has a substantially higher resistance than the transistor 19 when in the ON state. When a logic low is applied to the control terminal C, the lower resistance transistor 19 is ON the and higher resistance transistor is 18 is OFF, providing a first slew rate. When the signal at terminal C is logic high, the transistor 18 is ON and the transistor 19 is OFF, coupling a higher resistance between the input terminal 1 and the gate 10, thereby providing a second, slower slew rate.

Figure 1D:
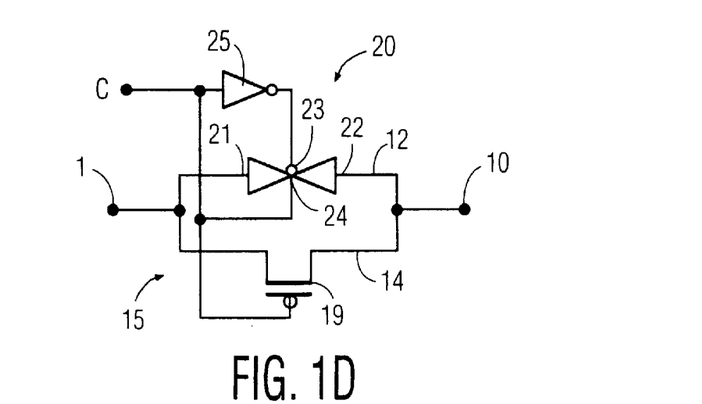

FIG. 1(d) shows another embodiment in which the transistor 18 is replaced by a pass gate 20. FIG. 1(d) also includes a logic element, inverter 25. The pass gate 20 has an input 21 coupled to the first terminal 1 and an output 22 coupled to the gate 10. The pass gate 20 further includes a PMOS control terminal 23 coupled to the output of inverter 25, whose input is coupled to slew rate control terminal C. Terminal C is coupled directly to the NMOS control terminal 24 of pass gate 20 and to the gate of PMOS transistor 19. The function of the inverter 25 is to provide the complement of the slew rate control signal to the PMOS terminal 23.

Pass gates are well known in the art, and reference may be made for example to the text: Weste, Neil, *Principles of CMOS VLSI Design*, Addison-Wesley Publishing, Menlo Park, Calif. 1985, pp. 55–57. Pass gates employ both NMOS and PMOS transistors, and are typically used for passing low and high logic signals without degradation. Pass gates are commonly used in multiplexors for this purpose.

Additionally, the pass gate 20 is used here for a different purpose, namely as a switchable resistor to selectively control the slew rate of the pull down device 7. A pass gate, since it has two transistors in parallel, can provide a desired resistance with a smaller device area than a single device, such as transistor 18. Here, the pass gate 20 has a higher resistance than the transistor 19 in their enabled (ON) states. When the signal at terminal C is logic high, the control terminals 24 and 23 would be logic high and logic low, respectively, enabling the pass gate 20. The second path 12 is an open circuit since the PMOS transistor 19 is OFF. Thus, with the pass gate 20 enabled, the input signal on input 1 is coupled to the gate 10 via a resistance provided by the pass gate 20. With pass gate 20 disabled, the input terminal is coupled via path 12 with a lower resistance. With the pass gate 20 enabled, the pull-down device 7 will turn on more slowly when the input transitions from low to high, or vice versa, as compared to when the pass gate is disabled. Thus, the slew rate of the terminal 3 with reference to terminal 1 will be slower with pass gate 20 enabled than when it is disabled.

Figure 2:
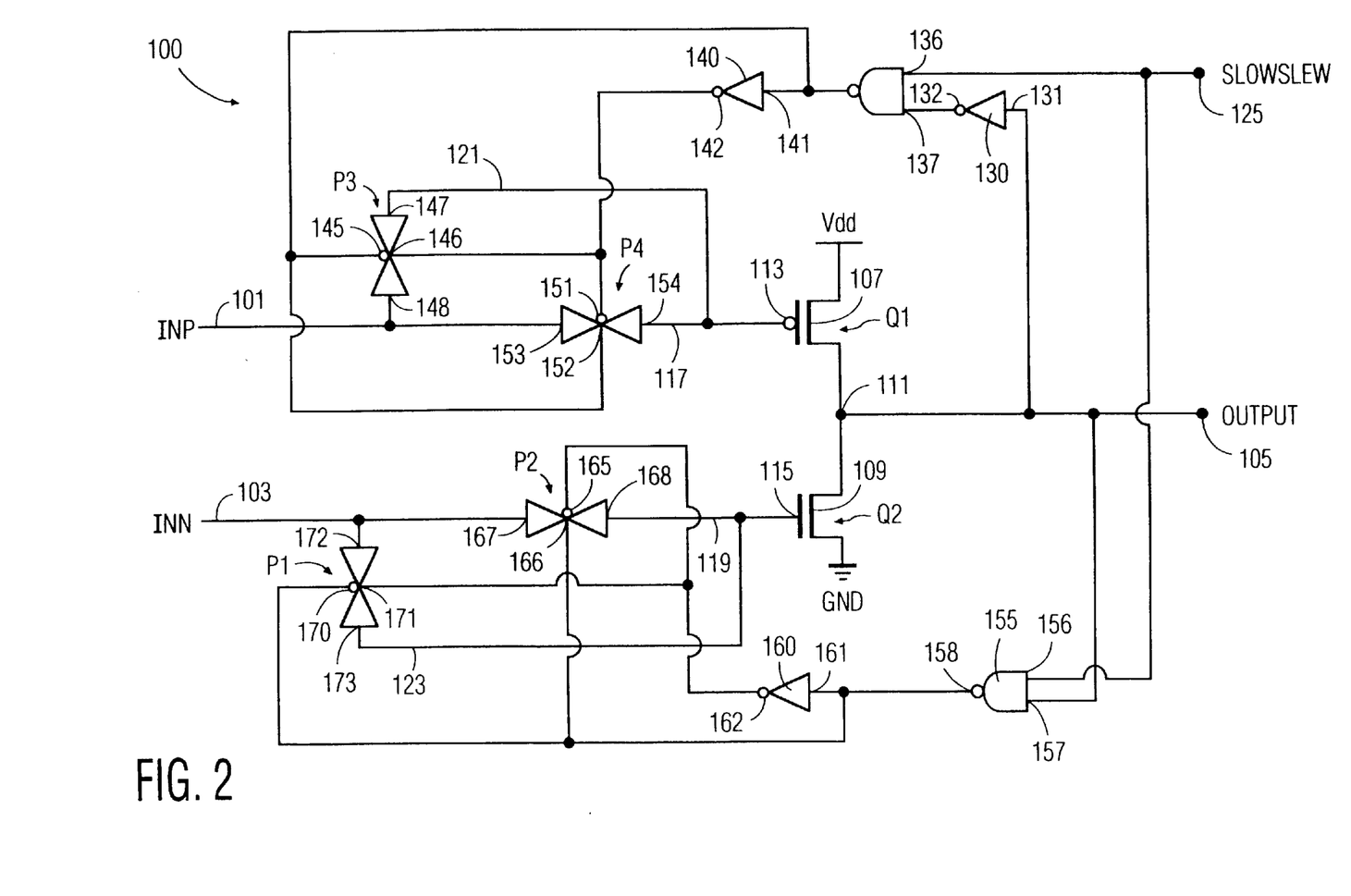
FIG. 2 is a circuit diagram of a tri-state output buffer with slew rate control employing pass gates according to the invention.

FIG. 2 is a circuit diagram of a tri-state output buffer 100 employing pass gates for slew rate control in a similar manner as the example of FIG. 1(*d*). The circuit has inputs 101 and 103 which receive logic inputs from another circuit. The output terminal 105 is coupled to a node 111 between first and second primary drive transistors Q1 and Q2 which have main current paths 107, 109 connected in series between a first supply Vdd and a second, lower supply, in this case ground. The source of transistor Q1 is coupled to the first supply Vdd and its drain is coupled to the source of transistor Q2, the drain of which is coupled to ground. Transistor Q1 is a PMOS transistor, serving as a pull-up device, and transistor Q2 is an NMOS transistor, serving as a pull-down device. The control terminals, or gates, 113, 115 of the drive transistors Q1 and Q2 are each coupled to respective ones of the inputs 101, 103 via (i) a respective high resistance path 121, 123 and (ii) a respective low resistance path 117, 119. The high resistance path 121 is formed by pass gate P3 coupling the input terminal 101 to the gate 113 of the transistor Q1 through its input and output terminals 148, 147. The high resistance path 123 for the other drive transistor Q2 is formed by pass gate P1 having input terminal 172 coupled to the input terminal 103 and its output 173 coupled to the gate 115 of the transistor Q2. Similarly, the low resistance paths 117, 119 are formed by pass gates P4 and P2 which couple the inputs 101, 103 to the control gates of the transistors Q1, Q2, respectively, through their input, output terminals 153, 154 and 167, 168.

When the pass gates P2 and P4 are active, they form respective low resistance paths which connect the inputs 101, 103 to the control gates of transistors Q1, Q2, providing a normal slew rate. When the pass gates P1 and P3 are active, they provide respective high resistance paths to the gates of the drive transistors Q1, Q2 to provide a slow slew rate.

The resistance of the pass gates is selected by controlling the dimensions of the PMOS and NMOS devices forming each pass gate. The pass gates P1, P3 and P2, P4 form substantially matched pairs. The pass gates P1, P3 are selected to have a relatively high resistance to provide the slow slew rate desired. The pass gates P2, P4 are selected to have a low resistance, as these pass gates mainly function as a switch to provide a low impedance conductive path when enabled and to render the paths 121, 123 non-conductive when the high resistance pass gates P1, P3 are enabled.

The pass gates are controlled by the state of the output terminal 105 and the slew rate control terminal 125. A control circuit having first and second control paths couples these terminals to the control terminals of the pass gates. The pass gates P3 and P4 are controlled by a first control path formed by an inverter 13C, a NAND gate 135, and a second inverter 140. The inverter 130 has its input 131 coupled to the output terminal 105 and its output 132 coupled to one input 137 of the NAND gate 135. The other input 136 of this NAND gate is coupled to the slew rate control terminal 125. The output 138 of the NAND gate 135 is coupled to the input 141 of the second inverter 140, as well as to the PMOS control terminal 145 of pass gate P3 and the NMOS control terminal 152 of the pass gate P4. The output 142 of the second inverter 140 is coupled to the PMOS control terminal 151 of the pass gate P4 and to the NMOS control terminal 146 of the pass gate P3.

A second control path is formed by a second NAND gate 155 and a third inverter 160. The NAND gate 155 has one input 156 coupled to the slew rate control terminal 125 and another input 157 coupled to the output terminal 105. The output 158 of this NAND gate is coupled to the input 161 of the inverter 160, as well as to the PMOS control terminal 170 of the pass gate P1 and to the NMOS control terminal 166 of the pass gate P2. The output 162 of inverter 160 is coupled to the PMOS control terminal 165 of the pass gate P2 and to the NMOS control terminal 171 of the pass gate P1.

Table 1 lists the states of the pass gates for the possible logic levels of the output terminal 105 and the slew rate control terminal 125.

TABLE 1

| SLEW INPUT | OUT- PUT | P1 | P2 | P3 | P4 |
|---|---|---|---|---|---|
| HIGH | HIGH | ENABLED | DISABLED | DISABLED | ENABLED |
| HIGH | LOW | DISABLED | ENABLED | ENABLED | DISABLED |
| LOW | HIGH | DISABLED | ENABLED | DISABLED | ENABLED |
| LOW | LOW | DISABLED | ENABLED | DISABLED | ENABLED |

The circuit operates as follows. When the slew rate input 125 is logic high, the slow slew rate mode is active and when the slew rate input is logic low, the normal slew rate mode is active. When both the output terminal 105 and the slew rate control terminal 125 are logic high, the output 132 of the inverter 130 and the input 137 of the NAND gate 135 is low. The input 136 of NAND gate 135 is high, so its output 138 is therefore high and the output 142 of inverter 140 is low. Consequently, a logic high is applied to the control terminal 145 of pass gate P3 while a logic low is applied to its NMOS terminal 146, so that the high resistance pass gate P3 is disabled. The opposite control signals are applied to the low resistance pass gate P4, making it enabled. With the same logic state at the output and slew rate control terminals, the output 158 of NAND gate 155 is low and the output 162 of inverter 160 is high. Consequently, logic low signals are applied to the PMOS and NMOS control terminals 170, 166, respectively, of pass gates P1 and P2, with the complementary signals being applied, respectively, to the NMOS and PMOS control terminals 171, 165 of these pass gates. This enables the high resistance pass gate P1 and disables the low resistance pass gate P2.

When the output terminal 105 is pulled to logic low and the slew rate control is still logic high, the high resistance pass gate P3, previously disabled, is enabled and the pass gate P1, previously enabled, is disabled. Similarly, the low resistance pass gate P4 is disabled and the pass gate P2 is enabled. This results because the output of NAND gate 135 is now low (instead of high) as in the previous example, so the opposite control signals are applied to the pass gates P3, P4. Similarly, the output of NAND gate 155, which was logic low when both the output and slew rate control were high, becomes logic high when the output terminal 105 is pulled low. Consequently, the opposite control signals are applied to the pass gates P1, P2, so their states switch as well.

It is noted that when the slow slew rate control signal is logic high, only one of the high resistance pass gates is enabled at a given time. This ensures that the drive transistors Q1, Q2 still turn off quickly even in the slow slew mode. In fact, the transistors Q1, Q2 turn off at the same speed as in the normal slew mode. When the buffer circuit 100 is not in a tri-state mode (to be described hereinafter), if the output terminal 105 is high, this means that the input signals INP, INN were previously low, with transistor Q1 conductive (ON) and transistor Q2 non-conductive (OFF). As evident from Table 1, high resistance pass gate P1 is enabled and P3 is disabled. When the input signals INN, INP transition from low to high, transistor Q2 will turn on slowly (slow slew rate) because pass gate P3 is enabled. However, transistor Q1 will turn OFF more quickly than transistor Q2 turns ON, because the logic high voltage at input 101 which turns OFF this PMOS device Q1 is coupled via the low resistance pass gate P4 to control terminal 113. Similarly, when the output 105 is logic low, this means that the inputs INP, INN are logic high, pull-up transistor Q1 is OFF and pull-down transistor Q2 is ON. When the input signals transition from high to low, pass gate P3 is already enabled so transistor Q1 will turn on slowly, yet transistor Q2 will turn off quickly since pass gate P1 was disabled and pass gate P2 was enabled prior to the transition.

When the slew rate control 125 is logic low, the high resistance pass gates P1, P3 are always disabled and the low resistance pass gates P2, P4 are always enabled. This is because the outputs 138, 158 of NAND gates 135, 155, each of which is coupled to a respective PMOS control terminal 145, 170, will always be logic high, so the high resistance pass gates P1, P3 will be kept disabled whenever slew rate input 125 is kept at logic low. Conversely, the outputs 142 and 162 of the inverters 140, 160 will always be logic high. Consequently, the NMOS inputs of 166, 152 of the pass gates P2, P4 will be logic high, with their PMOS terminals 165, 151 being logic low, so pass gates P2, P4 will always be enabled. Thus, both inputs INP and INN are coupled via a low resistance path to the control terminals of their respective control terminals 113, 115. When the inputs transition from low to high or high to low, the devices Q1, Q2 will both turn ON quickly and turn OFF quickly.

When the output buffer 100 is used to output a signal to the output terminal 105, the input signals INN, INP are related signals, having the same logic level. However, the output terminal can have a floating voltage or a voltage equal to a voltage input at the terminal 105, by placing the buffer in a so-called tri-state. This occurs when both of the devices Q1, Q2 are OFF. Both devices are turned OFF by applying a logic high signal to control terminal 113 and a logic low signal to the control terminal 115. The buffer 100 then presents a high impedance to the output terminal 105, and to any device or bus coupled thereto. By additional circuitry coupled to node 105, signals can then be input through terminal 105 when in the tri-state mode.

In the embodiment of the circuit shown in FIG. 2, the NMOS and PMOS transistors of the high resistance pass gates P1, P3 had a width dimension of one $\mu$m. The length dimensions ($\mu$m) were: P1 PMOS=2, NMOS=0.5; P3 PMOS, NMOS=0.35. In the low resistance pass gates P2, P4, the NMOS transistors and the PMOS transistors had a length dimension of 0.35 $\mu$m. The width dimensions ($\mu$m) were P2 PMOS=27.5, NMOS=30; P4 NMOS, PMOS=40, 27.5. In their enabled state, the low resistance pass gates P2, P4 provided a resistance of 142 and 115 $\Omega$'s respectively, as compared to the pass gates P1, P3, which had a resistance of 6.3 K$\Omega$'s, and 4.1 K$\Omega$'s, respectively. When enabled, the pass gates P1, P3 provided a slew rate of the drive transistors of about 0.5 V/ns as compared to the normal slew rate of about 2V/ns when the pass gates P1, P3 are disabled and the pass gates P2, P4 are enabled.

Figure 3:
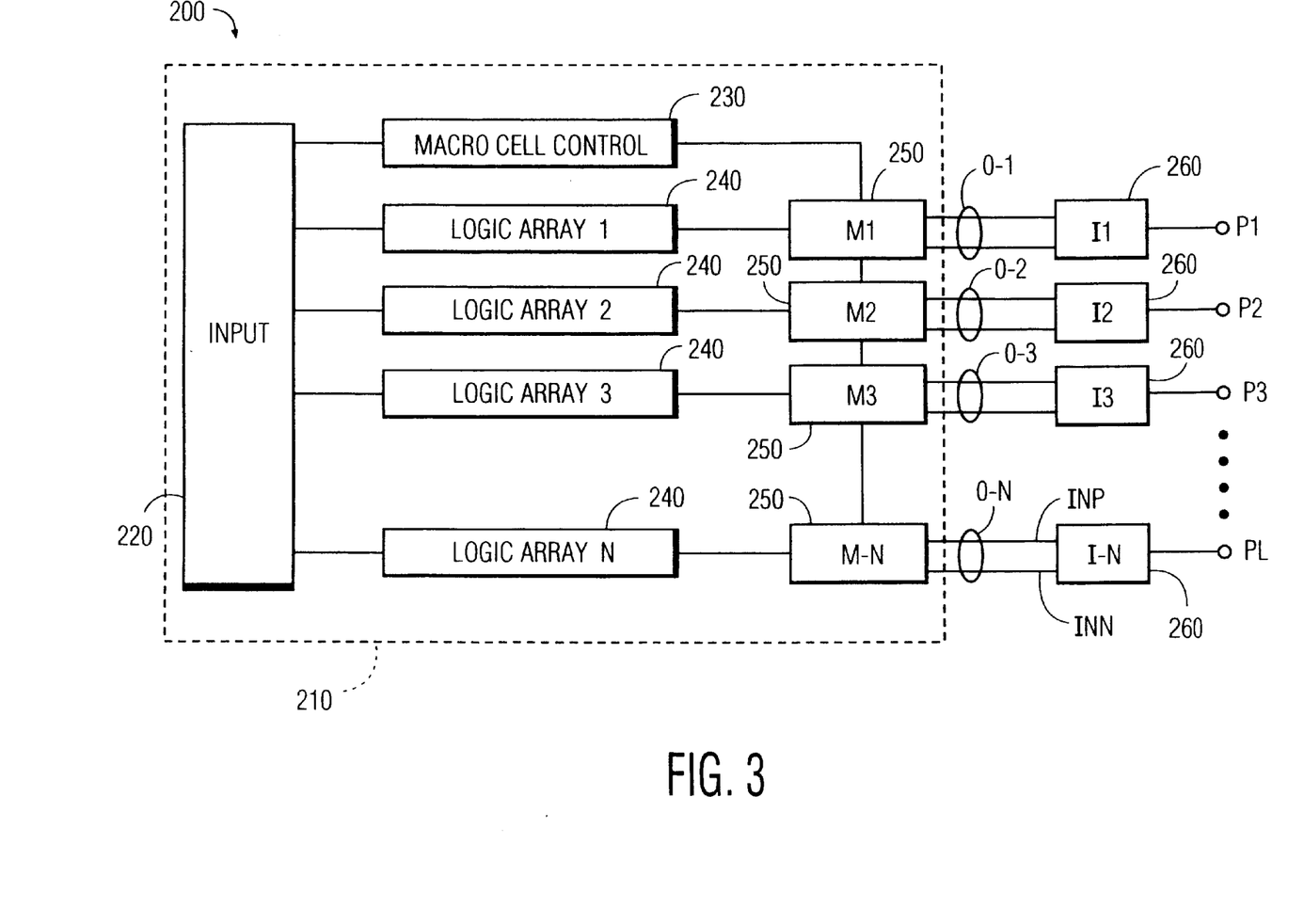
FIG. 3 is a block diagram of an exemplary binary signal processing device.

FIG. 3 illustrates an exemplary signal processing device 200 according to the invention having a plurality of interface circuits 260 (I1, I2, . . . –IN) each coupled to a connection pad or pin (P1, P2, . . . –PL). Each of the interface circuits is coupled to an associated output (O1, O2, . . . ON) of a binary signal processing core 210 of the device. In this example, the core is a programmable logic device having an input array 220, a plurality of macrocells (M1, M2 . . . MN) each connected to at least one logic array 240. The logic arrays include logic gates and allow the user to program various boolean equations based on data input to the input array 210. The macrocells 250 receive the logic output of one or more of the programmable logic arrays and control whether the logic outputs are sent to the connection pins via the interface circuits or are first rerouted internally. The macrocell control circuit 230 controls the macrocells to perform this function. Based on the logic output of the logic arrays, the macrocells provide the signals INP, INN of FIG. 2. If the circuit of FIG. 2 is implemented as the interface circuits, each interface circuit can be put in a tri-state condition as discussed above. In this receive an input signal, such as for controlling a function of the macrocell. Logic arrays and macrocells are well known in the art, and a further description herein is not necessary to understand the present invention.

Binary signal processing devices available today may have large numbers of interface circuits and output pads, for example, in the hundreds. If a large number of output pads were simultaneously switched from one logic level to another by the macrocells 250, it would cause a significant power consumption of the signal processing device due to the switching transients of the switching drive transistors. This is avoided by switching the associated interface circuits to a slow slew mode.

Figure 4:
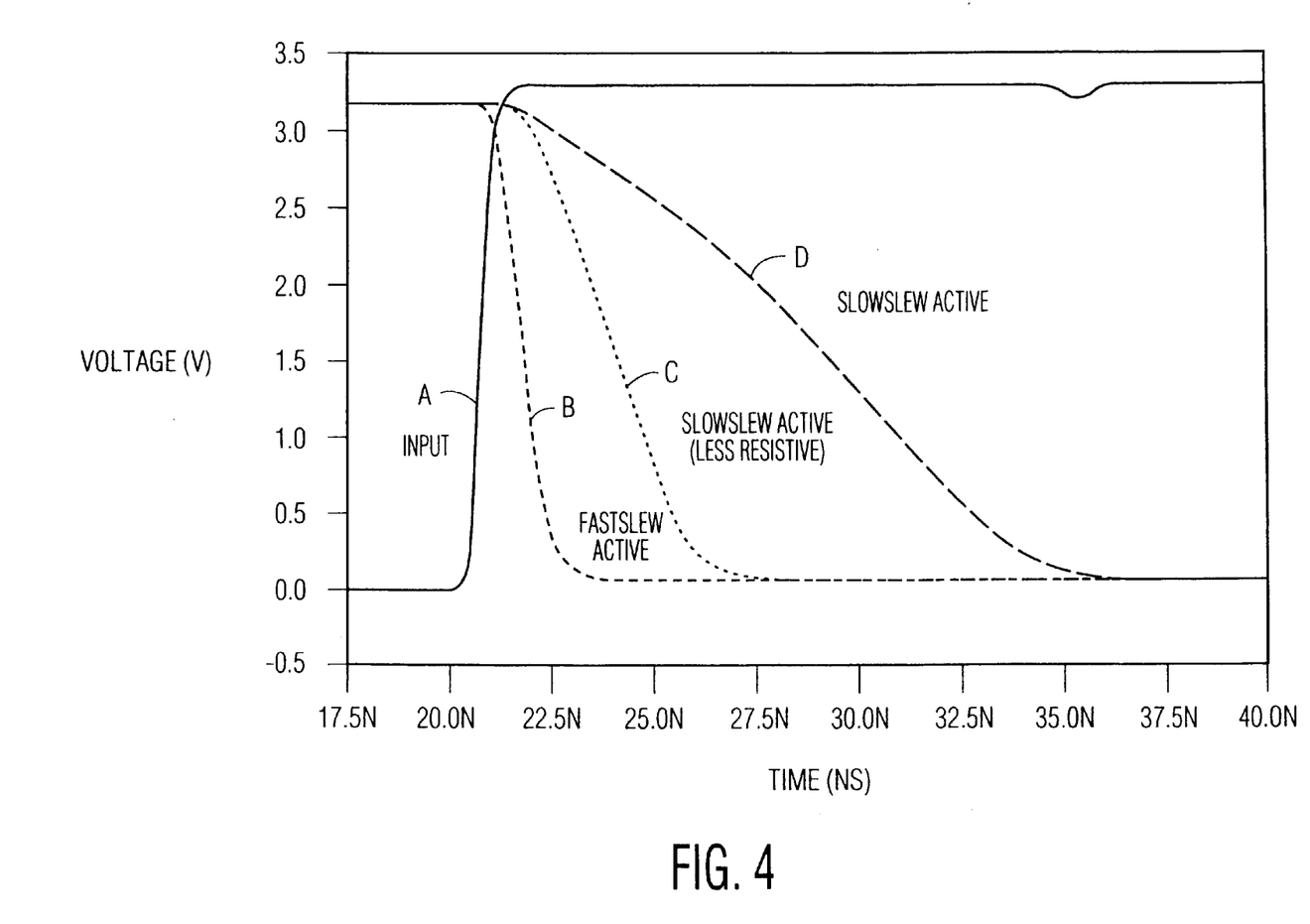
FIG. 4 is a graph illustrating the slow and normal slew rate modes for the pull-up device of FIG. 2.

FIG. 4 is a graph illustrating the voltage at the output terminal 105 of FIG. 2 (curves B, C, D) being pulled down by the pull down device Q2 in response to a transition of the input signal (curve A) at input terminals 103, 105 from logic low to logic high. In FIG. 4, the Y-axis is voltage with units Volts and the X-axis is Time in units (nanoseconds). Curve B is the voltage at the output node in the fast slew mode and curve C is the voltage at the output node in the slow slew mode for the pass gate dimensions given above. Curve D gives an example of an even slower slew rate obtained with the higher resistance values for the pass gates P1, P3 than those given above.

Accordingly, it can be seen that the various embodiments disclosed herein effectively implement a variable impedance between the input terminal and the control terminal of a drive transistor to control the slew rate of the drive transistor. Of significance, to control the slew rate of the drive transistor. Of significance, is that the pass gates use significantly less area than the devices shown in U.S. Pat. No. 5,500,611 due to (i) the impedance not being coupled in the current path between the supply terminal and the output and/or (ii) the use of parallel transistors, such as in a pass gate. In particular, the devices in this patent would need a width of over 1000 microns each, as compared to the pass gates of the present invention having a width of only 30 microns, to provide a PCI compliant device. This is a space savings on the order of 72% for one interface circuit. This translates into significant area savings when typically several hundred of such interface circuits would be used in complex PLD's.

Although preferred embodiments of the present invention have been shown and described, it will be appreciated by those skilled in the art that changes may be made in these embodiments without departing from the principles and spirit of the invention, the scope of which is defined in the claims. For example, those of ordinary skill in the art will appreciate that the sizes of the pass gates can be varied to achieve the resistances necessary for the desired slew rates, based on the voltages of the logic levels and supply rails etc. The control paths may also be modified, for example, so that a low logic level activates the slow slew mode. Additionally, instead of parallel pairs of pass gates, other numbers of pass gates combined in various parallel and/or serial configurations may be used to implement a variable resistance with multiple discrete resistance levels to achieve multiple slew rate levels. The process or technology by which the circuit of the processes can be used. Additionally, BiCMOS processes can also be used in which the drive transistors are bipolar devices.

The many features and advantages of the invention are apparent from the detailed specification and it is intended by the appended claims to cover all such features and advantages which fall within the true spirit and scope of the invention. Since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An interface circuit, comprising:
an input terminal for receiving an input signal;
an output terminal;
a power supply terminal;
a drive transistor having a control terminal coupled to said input terminal to receive the input signal, and a main current path which couples said output terminal to said power supply terminal in response to an input signal received at said input terminal; and
a slew rate control device having an impedance selectively coupleable between said input terminal and said control terminal of said drive transistor to selectively reduce the slew rate of a signal at the output terminal relative to the input signal.

2. An interface circuit according to claim 1, wherein said slew rate control device comprises a first slew rate control transistor having a main current path coupled between said input terminal and said control terminal of said drive transistor, said main current path being switchable between an enabled state, in which said main current path provides an impedance between said input terminal and said control gate of said drive transistor, and a disabled state.

3. An interface circuit according to claim 2, wherein said slew rate control device comprises a second of said slew rate control transistors electrically in parallel with said main current path of said first slew rate control transistor.

4. An interface circuit according to claim 3, further comprising control means for mutually exclusively disabling one of said first and second slew rate control transistors and enabling the other of said first and second slew rate control transistors.

5. An interface circuit according to claim 4, wherein said control means comprises a slew rate control input for receiving a slew rate control signal, said first and second slew rate control transistors are of the opposite conductivity type and have control terminals coupled to said slew rate control input so that in response to a first slew rate control signal said first slew rate control transistor is disabled and said second slew rate control transistor is enabled and in response to a second slew rate control signal said first slew rate control transistor is enabled and the second slew rate control transistor is disabled.

6. An interface circuit according to claim 4, wherein said control means comprises a slew rate control input for receiving a slew rate control signal, said first and second slew rate control transistors being of the same conductivity type and having respective control terminals, and a logic circuit between said control terminals of said first and second slew rate control transistors for disabling one of said first and second transistors while enabling the other of said first and second slew rate control transistors.

7. An interface circuit according to claim 1, wherein said slew rate control device comprises a pass gate coupled between said input terminal and said control terminal of said drive transistor, said pass gate having control terminals and being switchable between a disabled and an enabled state, in the enabled state said pass gate exhibiting an impedance; and
further comprising a slew rate control input coupled to said control terminals of said pass gate, said pass gate being enabled by a slew rate control signal received at said slew rate control terminal to enable said pass gate and couple said impedance between said input terminal and said control terminal of said drive transistor.

8. An interface circuit according to claim 7, further comprising a second pass gate coupled electrically in parallel with said first pass gate between said input terminal and said control terminal of said drive transistor, said second pass gate having control terminals and a second impedance different from said first impedance.

9. An interface circuit according to claim 8, further comprising a control circuit coupled to said slew rate control input and to said control terminals of said pass gates and which in response to a slew rate control signal mutually exclusively disables one of said pass gates and enables the other of said pass gates.

10. An interface circuit according to claim 9, wherein said control circuit is further coupled to said output terminal and controls said pass gates in dependence of a voltage level of said output terminal.

11. An interface circuit according to claim 5, wherein said control circuit controls said pass gates so that said drive transistor turns off more rapidly than said drive transistor turns on.

12. An interface circuit according to claim 9, wherein said control circuit is further coupled to said output terminal and controls said pass gate in dependence of a voltage level of said output terminal.

13. An interface circuit according to claim 12, wherein said control circuit controls said pass gate so that said drive transistor turns off more rapidly than said drive transistor turns on.

14. An interface circuit according to claim 1, wherein said drive transistor is a pull-up device.

15. An interface circuit according to claim 1, wherein said drive transistor is a pull-down device.

16. A tri-state output buffer circuit, comprising:

first and second input terminals for receiving input signals;

an output terminal;

a pull-up device having a control terminal, and a main current path coupling the output terminal to a first power supply;

a pull-down device having a control terminal, and a main current path coupling the output terminal to a second power supply lower than the first supply;

a first pass gate and a second pass gate, each of said first and second pass gates having an input coupled to said second input terminal and an output coupled to said control terminal of said pull-down device, a third and a fourth pass gate, each of said third and fourth pass gates having an input coupled to said first input terminal and an output coupled to said control terminal of said pull-up device, each of said pass gates having control terminals and being switchable between an enabled and a disabled state, in the enabled state said first and third pass gates each having a first resistance and said second and fourth pass gates having a second resistance lower than said first resistance;

a slew rate control input; and a control circuit coupled to said slew rate control input and to said control terminal of each of said pass gates and which controls the state of said pass gates in response to a control signal received at said slew rate input.

17. An output buffer circuit according to claim 16, wherein said control circuit is coupled to said output terminal and controls the first and second pass gates in dependence on a voltage level of said output terminal.

18. An output buffer circuit according to claim 17, wherein said control circuit controls said pass gates such that when said slew rate control input receives a signal indicative of a slow slew rate and said output terminal is logic high, said first and fourth pass gates are enabled and said second and third pass gates are disabled.

19. An output buffer circuit according to claim 17, wherein when said output terminal is logic low while the slew rate control signal is indicative of a slow slew rate, said control circuit disables said first and fourth pass gates and enables said second and third pass gates.

20. An output buffer circuit according to claim 17, wherein said control circuit maintains said first and third pass gates in mutually exclusive ones of the enabled and disabled states relative to said second and fourth pass gates, respectively.

21. An output driver circuit according to claim 17, wherein said control circuit comprises logic gates.

22. A binary signal processing device, comprising:

a binary signal processing circuit having a plurality of outputs, a plurality of connection pins; and a plurality of interface circuits, each interface circuit including:

an input terminal coupled to an associated one of said outputs of plurality of outputs of said binary signal processing circuit, an output terminal coupled to a said connection pin, a drive transistor having a control terminal, and a main current path which couples said output terminal to a voltage supply terminal, and a slew rate control device having an impedance selectively coupleable between said input terminal and said control terminal of said drive transistor to selectively reduce the slew rate of a signal at the output terminal relative to the input signal.

23. A binary signal processing device according to claim 22, wherein:

said slew rate control device comprises a pass gate coupled between said input terminal and said control terminal of said drive transistor, said pass gate having control terminals and being switchable between an enabled and a disabled state, in the enabled state said pass gate having a resistance, and further comprising a slew rate control input coupled to said control terminals of said pass gate, said pass gate being enabled by a slew rate control signal received at said slew rate control terminal to enable said pass gate and provide said resistance between said input terminal and said control terminal of said drive transistor.

24. A binary signal processing device according to claim 23, wherein at least one of said interface circuits further comprises a second pass gate coupled electrically in parallel with said first pass gate between said input terminal and control terminal of said drive transistor, said second pass gate having control terminals and a second resistance different from said first resistance.

25. A binary signal processing device according to claim 23, wherein said at least one interface circuit further comprises a control circuit coupled to said slew rate control input and to said pass gates and which in response to a slew rate control signal mutually exclusively disables one of said pass gates and enables the other of said pass gates.

26. A binary signal processing device according to claim 25,, wherein said control circuit of said at least one interface circuit is further coupled to said output terminal and controls said pass gates in dependence of a voltage level of said output terminal.

* * * * *